(12) United States Patent
Hwang et al.

(10) Patent No.: US 7,492,647 B2
(45) Date of Patent: Feb. 17, 2009

(54) VOLTAGE GENERATION CIRCUIT AND SEMICONDUCTOR MEMORY DEVICE INCLUDING THE SAME

(75) Inventors: Hyong-Ryol Hwang, Seoul (KR); Young-Hyun Jun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/025,442

(22) Filed: Feb. 4, 2008

(65) Prior Publication Data

US 2008/0122523 A1 May 29, 2008

Related U.S. Application Data

(62) Division of application No. 11/293,890, filed on Dec. 2, 2005, now Pat. No. 7,349,268.

(30) Foreign Application Priority Data

Dec. 6, 2004 (KR) ...................... 10-2004-0101925

(51) Int. Cl.
*G11C 7/00* (2006.01)
(52) U.S. Cl. ............................ 365/189.11; 365/189.09; 365/222; 365/194
(58) Field of Classification Search ............ 365/189.11, 365/198.09, 222, 194, 189.011, 189.09
See application file for complete search history.

(56) References Cited

U.S. PATENT DOCUMENTS

| 6,320,457 | B1 * | 11/2001 | Yang ........................... 327/536 |
| 6,356,501 | B2 * | 3/2002 | Park et al. .................... 365/226 |
| 7,042,774 | B2 * | 5/2006 | Kim ....................... 365/189.11 |
| 7,319,626 | B2 * | 1/2008 | Cheon ......................... 365/203 |

* cited by examiner

*Primary Examiner*—Connie C Yoha
(74) *Attorney, Agent, or Firm*—F. Chau & Assoc., LLC

(57) ABSTRACT

A voltage generation circuit and semiconductor memory device including the same are provided. The voltage generation circuit includes: a voltage level detector, which detects a level of a first high voltage to generate a first high voltage level detection signal and detects a level of a second high voltage to generate a second high voltage level detection signal; a control signal generator, which generates at least four pumping control signals in sequence when the first high voltage level detection signal is active, generates a control signal when the first high voltage level detection signal is inactive, and generates a first one of the at least four pumping control signals in response to a level of a power supply voltage; and a voltage generator, which pumps a boost node in response to the at least four pumping control signals to generate the first high voltage and transmits charge from the boost node to a second high voltage generation terminal in response to the control signal to generate the second high voltage.

18 Claims, 10 Drawing Sheets

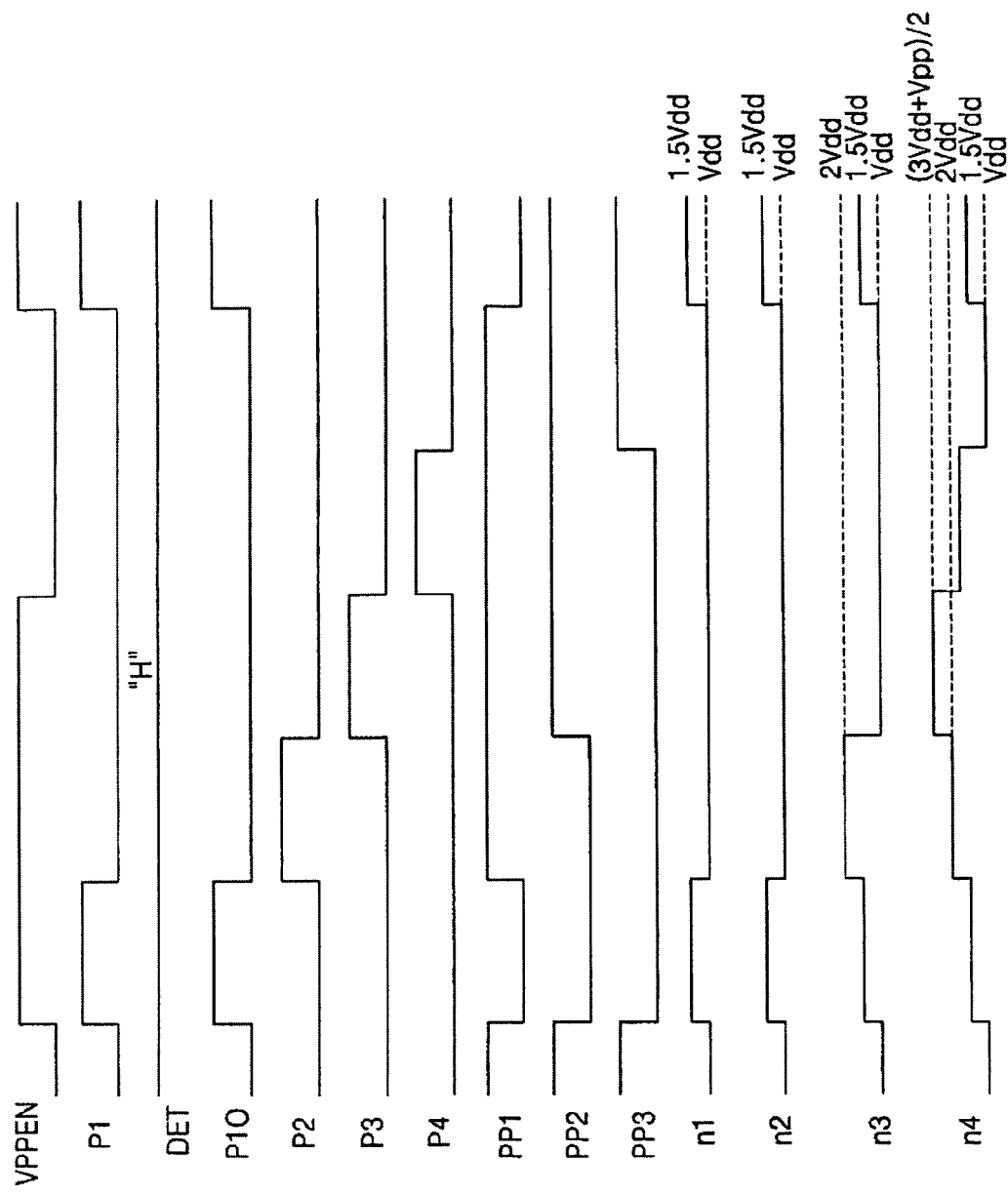

VOLTAGE GENERATION CIRCUIT AND SEMICONDUCTOR MEMORY DEVICE INCLUDING THE SAME

CROSS-REFERENCE TO RELATED APPLICATION

This is a divisional application of U.S. application Ser. No. 11/293,890, filed Dec. 2, 2005 now U.S. Pat. No. 7,349,268, which claims foreign priority under 35 U.S.C. § 119 to Korean Patent Application No. 2004-101925 filed Dec. 6, 2004 which is hereby incorporated by reference for all purposes as if fully set forth herein.

BACKGROUND OF THE INVENTION

1. Field of the Invention

The present invention relates to a semiconductor memory device and, more particularly, to a voltage generation circuit, which can generate voltages of two levels that are higher than a power supply voltage, and a semiconductor memory device including the same.

2. Description of the Related Art

A conventional semiconductor memory device makes use of a voltage level higher than a power supply voltage to drive a word line and makes use of a precharge voltage equal to or half of the power supply voltage to precharge a bit line. For this reason, the semiconductor memory device includes a high voltage generator to generate the high voltage and a precharge voltage generator to generate the precharge voltage.

The inclusion of both these voltage generators is because the power supply voltage of the conventional semiconductor memory device is high. As the voltage level of the power supply of the semiconductor memory device is reduced to 1.2 V or less, the precharge voltage for precharging the bit line should be lower than the voltage applied to the word line and higher than the power supply voltage. Accordingly, a precharge voltage that is different from that of the conventional semiconductor memory device from the precharge voltage is needed.

When the precharge voltage is equal to or half of the power supply voltage, the precharge voltage generator is configured without a capacitor. However, when the precharge voltage is higher than the power supply voltage, the precharge voltage generator typically includes a capacitor to pump the power supply voltage.

Therefore, a semiconductor memory device using a low power supply voltage has an increased layout area compared to a semiconductor memory device using a high power supply voltage, because both a high voltage generator and a precharge voltage generator include capacitors.

SUMMARY OF THE INVENTION

One embodiment of the invention provides a voltage generation circuit, which generates two different levels of boost voltage that are higher than a power supply voltage by sharing a capacitor, thereby integrating into a small layout area.

Another embodiment of the invention provides a semiconductor memory device including the above-described voltage generation circuit.

In one aspect of the present invention, a voltage generation circuit includes a voltage level detector, which detects a level of a first high voltage to generate a first high voltage level detection signal and detects a level of a second high voltage to generate a second high voltage level detection signal; a control signal generator, which generates at least three pumping control signals in sequence in response to the first high voltage level detection signal and generates at least one of the at least three pumping control signals in response to the second high voltage level detection signal, and a voltage generator, which pumps a boost node in response to the at least three pumping control signals to generate the first high voltage and pumps the boost node in response to the at least one of the at least three pumping control signals to generate the second high voltage.

When the first and second high voltage level detection signals are active at about the same time, the control signal generator may alternately perform an operation of generating a first one, a second one, and a third one of the at least three pumping control signals in sequence and an operation of generating the at least one of the at least three pumping control signals. The control signal generator may include a detection signal generator, which generates a first detection signal when the first high voltage level detection signal is active, generates a second detection signal when the second high voltage level detection signal is active, and generates a third detection signal when the first and second high voltage level detection signals are active at about the same time, an oscillation signal generator, which generates a first oscillation signal in response to the first high voltage level detection signal or the second high voltage level detection signal and generates a second oscillation signal by dividing the first oscillation signal, a first high voltage pumping control signal generator, which generates a first signal from the second oscillation signal when the third detection signal is generated and generates a first high voltage pumping control signal from the first oscillation signal in response to the first high voltage level detection signal or the first signal, and a second high voltage pumping control signal generator, which generates a second signal from an inverted second oscillation signal when the third detection signal is generated and generates a second high voltage pumping control signal from the first oscillation signal in response to the second high voltage level detection signal or the second signal, wherein the control signal generator generates the at least three pumping control signals in response to the first high voltage pumping control signal and generates the at least one of the at least three pumping control signals in response to the second high voltage pumping control signal. The control signal generator may generate a first precharge control signal in response to the first one of the at least three pumping control signals, a second precharge control signal in response to the first one and the second one of the at least three pumping control signals, and a third precharge control signal in response to the first one, the second one, and the third one of the at least three pumping control signals.

In one embodiment, the voltage generator may include a first and second pumping and precharge unit, which pumps a first node and a second node in response to the first one of the at least three pumping control signals and performs charge sharing operations between the first node and the boost node and between the second node and a third node during the generation of the first high voltage, and precharges the first and second nodes in response to the first precharge control signal, a third pumping and precharge unit, which pumps the third node in response to the second one of the at least three pumping control signals and performs a charge sharing operation between the third node and the boost node during the generation of the first high voltage, and precharges the third node in response to the second precharge control signal, and a fourth pumping and precharge unit, which pumps the boost node in response to the third one of the at least three pumping control signals and performs a charge sharing operation between the boost node and a first high voltage generation terminal during the generation of the first high voltage, pumps the boost node in response to the third one of the at least three pumping control signals and performs a charge sharing operation between the boost node and a second high voltage generation terminal during the generation of the second high voltage, and precharges the boost node in response to the third precharge control signal. In another embodiment, the voltage generator may include a first and second pumping and precharge unit, which pumps a first node and a second node in response to the first one of the at least three pumping control signals and performs charge sharing operations between the first node and the boost node and between the second node and a third node during the generation of the first high voltage, and precharges the first and second nodes, a third pumping and precharge unit, which pumps the third node in response to the second one of the at least three pumping control signals and performs a charge sharing operation between the third node and the boost node during the generation of the first and second high voltages, and precharges the third node, and a fourth pumping and precharge unit, which pumps the boost node in response to the third one of the at least three pumping control signals and performs a charge sharing operation between the boost node and a first high voltage generation terminal during the generation of the first high voltage, pumps the boost node in response to the third one of the at least three pumping control signals and performs a charge sharing operation between the boost node and a second high voltage generation terminal during the generation of the second high voltage, and precharges the boost node.

In a second aspect of the present invention, a voltage generation circuit includes a voltage level detector, which detects a level of a first high voltage to generate a first high voltage level detection signal and detects a level of a second high voltage to generate a second high voltage level detection signal, a control signal generator, which generates at least four pumping control signals in sequence when the first high voltage level detection signal is active and generates a control signal when the first high voltage level detection signal is inactive, and a voltage generator, which pumps a boost node in response to the at least four pumping control signals to generate the first high voltage and transmits charge from the boost node to a second high voltage generation terminal in response to the control signal to generate the second high voltage.

The control signal generator may activate a first one, a second one, and a third one of the at least four pumping control signals, which are activated in sequence during the active period of the first high voltage level detection signal, activate a fourth one of the at least four pumping control signals, which is activated during the inactive period of the first high voltage level detection signal, and generate a first precharge control signal in response to the first one of the at least four pumping control signals, a second precharge control signal in response to the first one and the second one of the at least four pumping control signals, and a third precharge control signal in response to the first one of the at least four pumping control signals and the control signal.

In a third aspect of the present invention, a voltage generation circuit includes a voltage level detector, which detects a level of a first high voltage to generate a first high voltage level detection signal and detects a level of a second high voltage to generate a second high voltage level detection signal, a control signal generator, which generates at least four pumping control signals in sequence when the first high voltage level detection signal is active, generates a control signal when the first high voltage level detection signal is inactive, and generates a first one of the at least four pumping control signals in response to a level of a power supply voltage, and a voltage generator, which pumps a boost node in response to the at least four pumping control signals to generate the first high voltage and transmits charge from the boost node to a second high voltage generation terminal in response to the control signal to generate the second high voltage.

The control signal generator may include a power supply voltage level detector, which generates the first one of the at least four pumping control signals in response to the level of the power supply voltage, receives the first one of the at least four pumping control signals and outputs an output signal when the power supply voltage is at a predetermined level or higher, and deactivates the first one of the at least four pumping control signals when the power supply voltage is at a level lower than the predetermined level.

The control signal generator may activate the first one, a second one, and a third one of the at least foul pumping control signals, which are activated in sequence during the active period of the first high voltage level detection signal, activate a fourth one of the at least four pumping control signals, which is activated during the inactive period of the first high voltage level detection signal, generate a first precharge control signal in response to the first one of the at least four pumping control signals, a second precharge control signal in response to the first one and the second one of the at least four pumping control signals, and a third precharge control signal in response to the first one of the at least four pumping control signals and the control signal, activate the first one of the at least four pumping control signals when the power supply voltage is at a high level, and deactivate the first one of the at least four pumping control signals when the power supply voltage is at a low level.

In the second and third aspects of the present invention, the voltage generator may include a first high voltage generator, which pumps the boost node in response to the at least four pumping control signals to generate the first high voltage, and a second high voltage generator, which transmits charge from the boost node to the second high voltage generation terminal in response to the control signal and the second high voltage level detection signal to generate the second high voltage. The first high voltage generator may include a first and second pumping and precharge unit, which pumps a first node and a second node in response to the first one of the at least four pumping control signals and performs charge sharing operations between the first node and the boost node and between the second node and a third node during the generation of the first high voltage, and precharges the first and second nodes in response to the first precharge control signal, a third pumping and precharge unit, which pumps the third node in response to the second one of the at least four pumping control signals and performs a charge sharing operation between the third node and the boost node during the generation of the first and second high voltages and precharges the third node in response to the second precharge control signal, and a fourth pumping and precharge unit, which pumps the boost node in response to the third one of the at least four pumping control signals and performs a charge sharing operation between the boost node and a first high voltage generation terminal during the generation of the first high voltage, pumps the boost node in response to the third one of the at least four pumping control signals and performs a charge sharing operation between the boost node and a second high voltage generation terminal during the generation of the second high voltage, and precharges the boost node in response to the third precharge control signal. The second high voltage generator may include a second high voltage generation unit, which transmits charge from the boost node to the second high voltage generation terminal in response to the control signal and the second high voltage level detection signal.

The first and second pumping and precharge unit may include a first switch, which is connected between the power supply voltage and the first node and precharges the first node in response to the first precharge control signal, a first capacitor, which pumps the first node in response to the first one of the at least four pumping control signals, a second switch, which is connected between the power supply voltage and the second node and precharges the second node in response to the first precharge control signal, a second capacitor, which pumps the second node in response to the first one of the at least four pumping control signals; a third switch, which is turned on in response to the first one of the at least four pumping control signals and allows charge to be shared by the first node and the boost node, and a fourth switch, which is turned on in response to the first one of the at least four pumping control signals and allows charge to be shared by the second node and the third node. The third pumping and precharge unit may include a fifth switch, which is connected between the power supply voltage and the third node and is turned on in response to the second precharge control signal to precharge the third node, a third capacitor, which pumps the third node in response to the second one of the at least four pumping control signals, and a sixth switch, which is turned on in response to the second one of the at least four pumping control signals and allows charge to be shared by the third node and the boost node. Also, the fourth pumping and precharge unit may include: a seventh switch, which is connected between the power supply voltage and the boost node and precharges the boost node in response to the third precharge control signal, a fourth capacitor, which pumps the boost node in response to the third one of the at least four pumping control signals, and an eighth switch, which allows charge to be shared by the boost node and the first high voltage generation terminal in response to the third one of the at least four pumping control signals during the generation of the first high voltage. The second high voltage generation unit may include a ninth switch, which transmits charge from the boost node in response to the control signal, and a tenth switch, which transmits charge transmitted from the ninth switch to the second high voltage generation terminal in response to the second high voltage level detection signal. The second high voltage generation unit may further include an eleventh switch, which transmits charge transmitted to the second high voltage generation terminal to a power supply voltage generation terminal when the second high voltage level detection signal is inactive.

In a fourth aspect of the present invention, a semiconductor memory device includes a voltage generation circuit including a voltage level detector, which detects a level of a high voltage to generate a high voltage level detection signal and detects a level of a precharge voltage to generate a precharge voltage level detection signal, a control signal detector, which generates at least foul pumping control signals in sequence when the high voltage level detection signal is active and generates a control signal when the high voltage level detection signal is inactive, and a voltage generator, which pumps a boost node in response to the at least four pumping control signals to generate the high voltage and transmits charge from the boost node to a precharge voltage generation terminal in response to the control signal to generate a precharge voltage.

BRIEF DESCRIPTION OF THE DRAWINGS

The foregoing and other features of the invention will be apparent from the following detailed description of preferred embodiments, as illustrated in the accompanying drawings.

FIGS. 7A and 7B are timing diagrams illustrating operations of the voltage generation circuit shown in FIG. 6.

DETAILED DESCRIPTION OF PREFERRED EMBODIMENTS

A voltage generation circuit and semiconductor memory device including the same according to the present invention will now be described more fully hereinafter with reference to the accompanying drawings.

Figure 1:
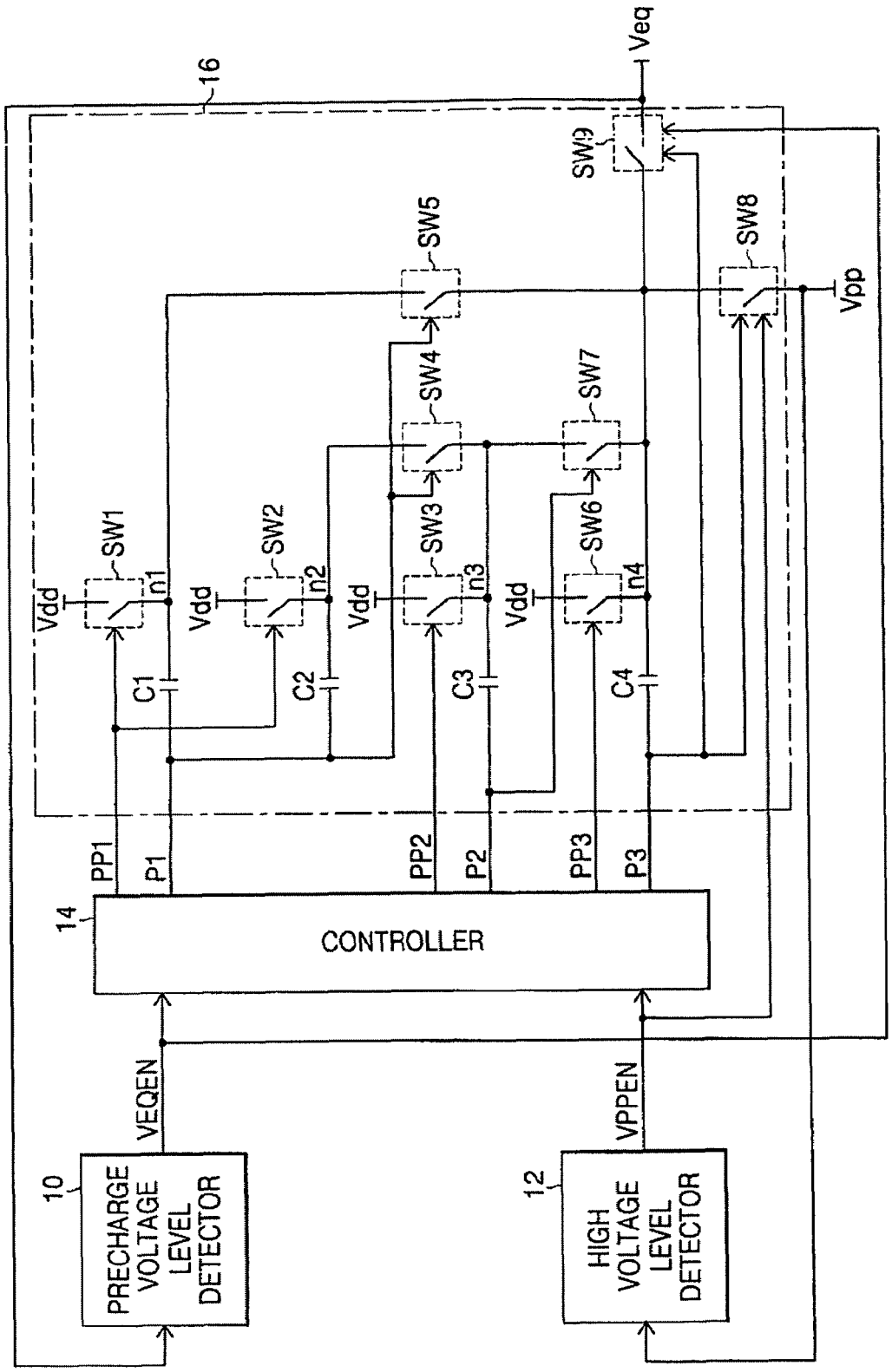
FIG. 1 is a block diagram of a voltage generation circuit according to an exemplary embodiment of the present invention.

FIG. 1 is a block diagram of a voltage generation circuit according to an exemplary embodiment of the present invention. Referring to FIG. 1, the voltage generation circuit includes a precharge voltage level detector 10, a high voltage level detector 12, a controller 14, and a high voltage and precharge voltage generator 16. The high voltage and precharge voltage generator 16 includes first through fourth capacitors C1-C4 and first through ninth switches SW1-SW9.

The precharge voltage level detector 10 receives a precharge voltage Veq and generates a precharge voltage level detection signal VEQEN when the precharge voltage Veq is at a level equal to or lower than a target level. The high voltage level detector 12 receives a high voltage Vpp and generates a high voltage level detection signal VPPEN when the high voltage Vpp is at a level equal to or lower than a target level. The controller 14 generates first through third pumping control signals P1-P3 and first through third precharge control signals PP1-PP3 in response to the precharge voltage level detection signal VEQEN and the high voltage level detection signal VPPEN. When the precharge voltage level detection signal VEQEN and the high voltage level detection signal VPPEN are active at the same time, the controller 14 alternately performs an operation of generating the first through third pumping control signals P1-P3 and the first through third precharge control signals PP1-PP3 in response to the high voltage level detection signal VPPEN and an operation of generating the third pumping control signal P3 and the third precharge control signal PP3 in response to the precharge voltage level detection signal VEQEN. The high voltage and precharge voltage generator 16 pumps a boost node n4 three times in response to the first through third pumping control signals P1-P3 and generates the high voltage Vpp. Also, the high voltage and precharge voltage generator 16 pumps the boost node n4 once in response to the third pumping control signal P3 and generates the precharge voltage Veq. The first, second, third and sixth switches SW1, SW2, SW3, and SW6 precharge first, second and third nodes n1, n2 and n3 and the boost node n4 to about the level of a power supply voltage Vdd, respectively in response to the first, second and third precharge control signals PP1, PP2, and PP3, which are at high logic levels. The first aid second capacitors C1 and C2 pump the first and second nodes n1 and n2, respectively, in response to the first pumping control signal P1 which is at a high logic level. The third capacitor C3 pumps the third node n3 in response to the second pumping control signal P2 that is at a high logic level, and the fourth capacitor C4 pumps the boost node n4 in response to the third pumping control signal P3 that is at a high logic level. The fourth and fifth switches SW4 and SW5 are turned on in response to the first pumping control signal P1 that is at a high logic level, the seventh switch SW7 is turned on in response to the second pumping control signal P2 that is at a high logic level, and the eighth switch SW8 is turned on in response to the third pumping control signal P3 and the high voltage level detection signal VPPEN that are at high logic levels. Also, the ninth switch SW9 is turned on in response to the third pumping control signal P3 and the precharge voltage level detection signal VEQEN that are at high logic levels.

The high voltage and precharge voltage generator 16 makes use of the first through fourth capacitors C1-C4 to generate the high voltage Vpp and makes use of the fourth capacitor C4 to generate the precharge voltage Veq. Since the high voltage and precharge voltage generator 16 needs no additional capacitors to generate the precharge voltage Veq, it has a small layout area.

Figure 2:
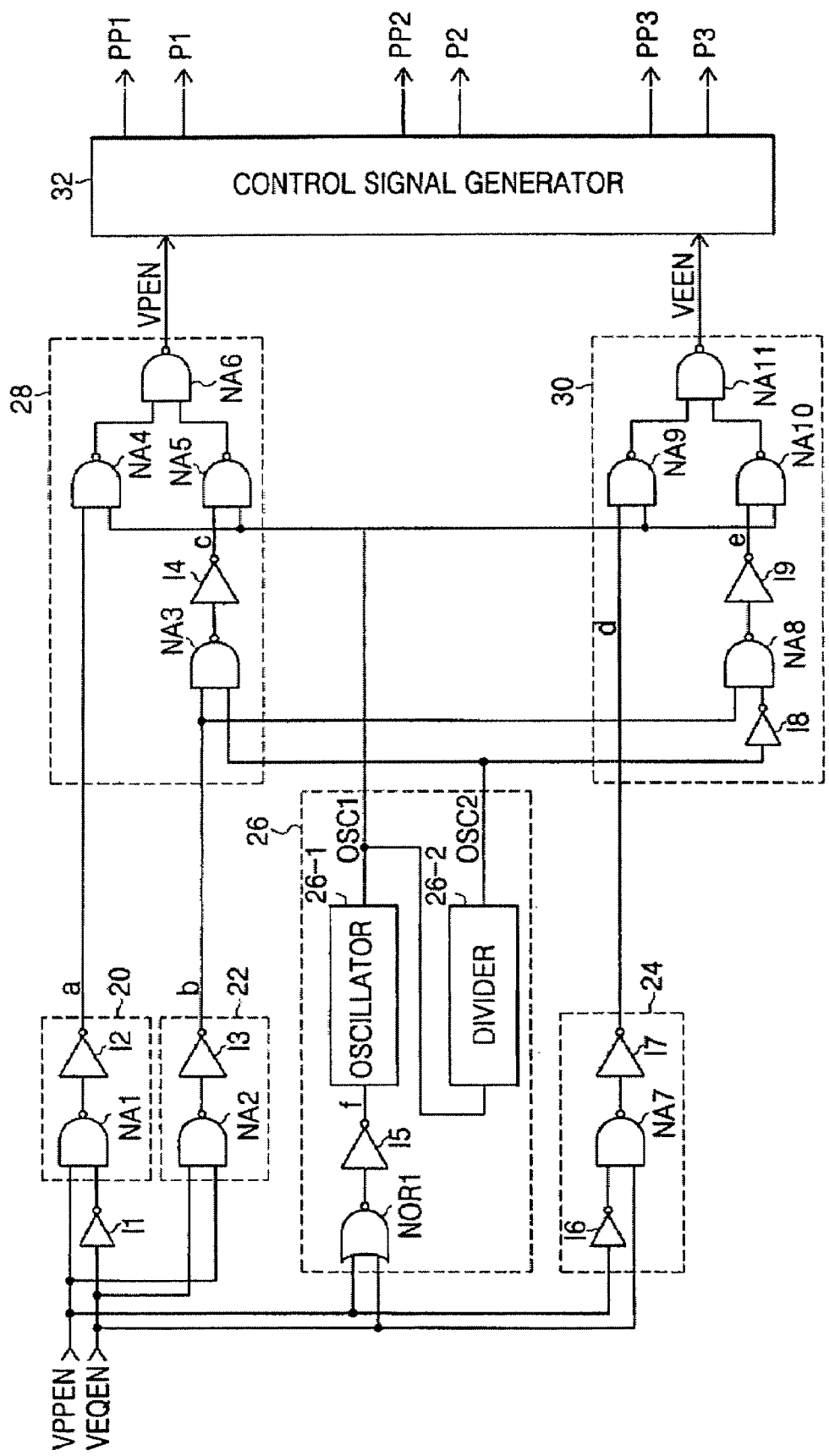
FIG. 2 is a block diagram of a controller shown in FIG. 1.

FIG. 2 is a block diagram of the controller shown in FIG. 1. Referring to FIG. 2, the controller 14 includes first, second and third detection circuits 20, 22, and 24, a pulse generator 26, a high voltage pumping control signal generator 28, a precharge voltage pumping control signal generator 30, and a control signal generator 32.

The first detection circuit 20 includes first and second inverters I1 and I2 and a first NAND gate NA1, and the second detection circuit 22 includes a second NAND gate NA2 and a third inverter I3. The third detection circuit 24 includes sixth and seventh inverters I6 and I7 and a seventh NAND gate NA7, and the pulse generator 26 includes a first NOR gate NOR1, a fifth inverter I5, an oscillator 26-1, and a divider 26-2. Also, the high voltage pumping control signal generator 28 includes third through sixth NAND gates NA3-NA6 and a fourth inverter I4, and the precharge voltage pumping control signal generator 30 includes eighth through eleventh NAND gates NA8-NA11 and eighth and ninth inverters I8 and I9.

The first detection circuit 20 generates a first signal a when only the high voltage level detection signal VPPEN is active. The second detection circuit 22 generates a second signal b when both the high voltage level detection signal VPPEN and the precharge voltage level detection signal VEQEN are active. The third detection circuit 24 generates a fourth signal d when only the precharge voltage level detection signal VEQEN is active. The pulse generator 26 generates a sixth signal f when at least one of the high voltage level detection signal VPPEN or the precharge voltage level detection signal VEQEN are active, generates a first oscillation signal OSC1 that oscillates at a predetermined frequency in response to the sixth signal f, and generates a second oscillation signal OSC2 by dividing the first oscillation signal OSC1. That is, the oscillator 26-1 generates the first oscillation signal OSC1 that oscillates in response to the sixth signal f, and the divider 26-2 divides the first oscillation signal OSC1 to generate the second oscillation signal OSC2. The high voltage pumping control signal generator 28 generates the second oscillation signal OSC2 as a third signal c when the second signal b is active and generates the first oscillation signal OSC1 as a high voltage pumping control signal VPEN when the third signal c or the first signal a are active. The precharge voltage pumping control signal generator 30 generates an inverted second oscillation signal OSC2 as a fifth signal e when the second signal b is active and the first oscillation signal OSC1 as a precharge voltage pumping control signal VEEN when the fourth signals d or the fifth signal e are active. The control signal generator 32 generates the first, second and third pumping control signals P1, P2, and P3, which are activated in sequence while the high voltage pumping control signal VPEN is active, and generates the first, second and third precharge control signals PP1, PP2, and PP3 corresponding to the first, second and third pumping control signals P1, P2, and P3, respectively.

Figure 3A:
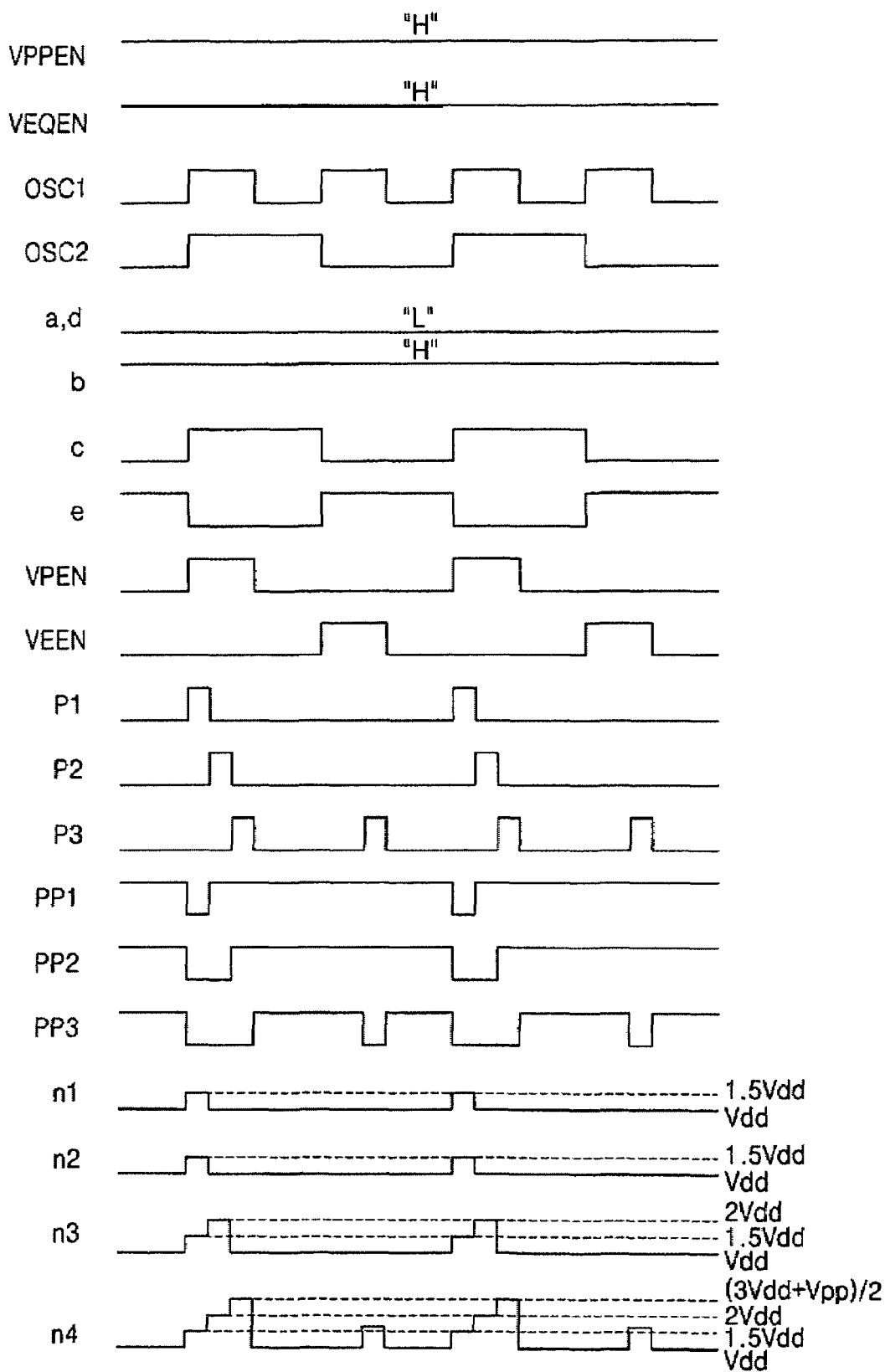
FIGS. 3A through 3C are timing diagrams illustrating operations of the voltage generation circuit and controller shown in FIGS. 1 and 2.
Figure 3B:
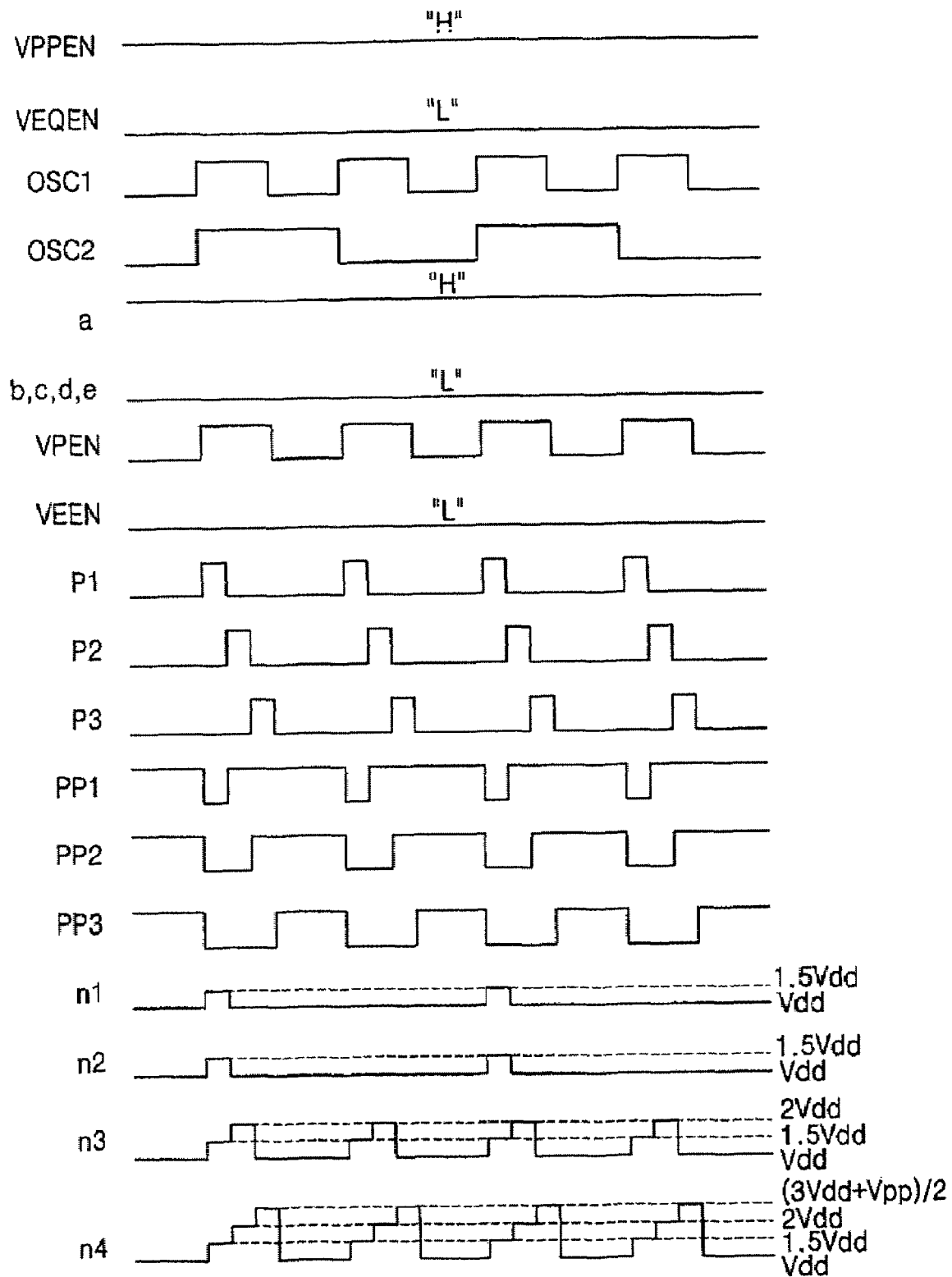
Figure 3C:
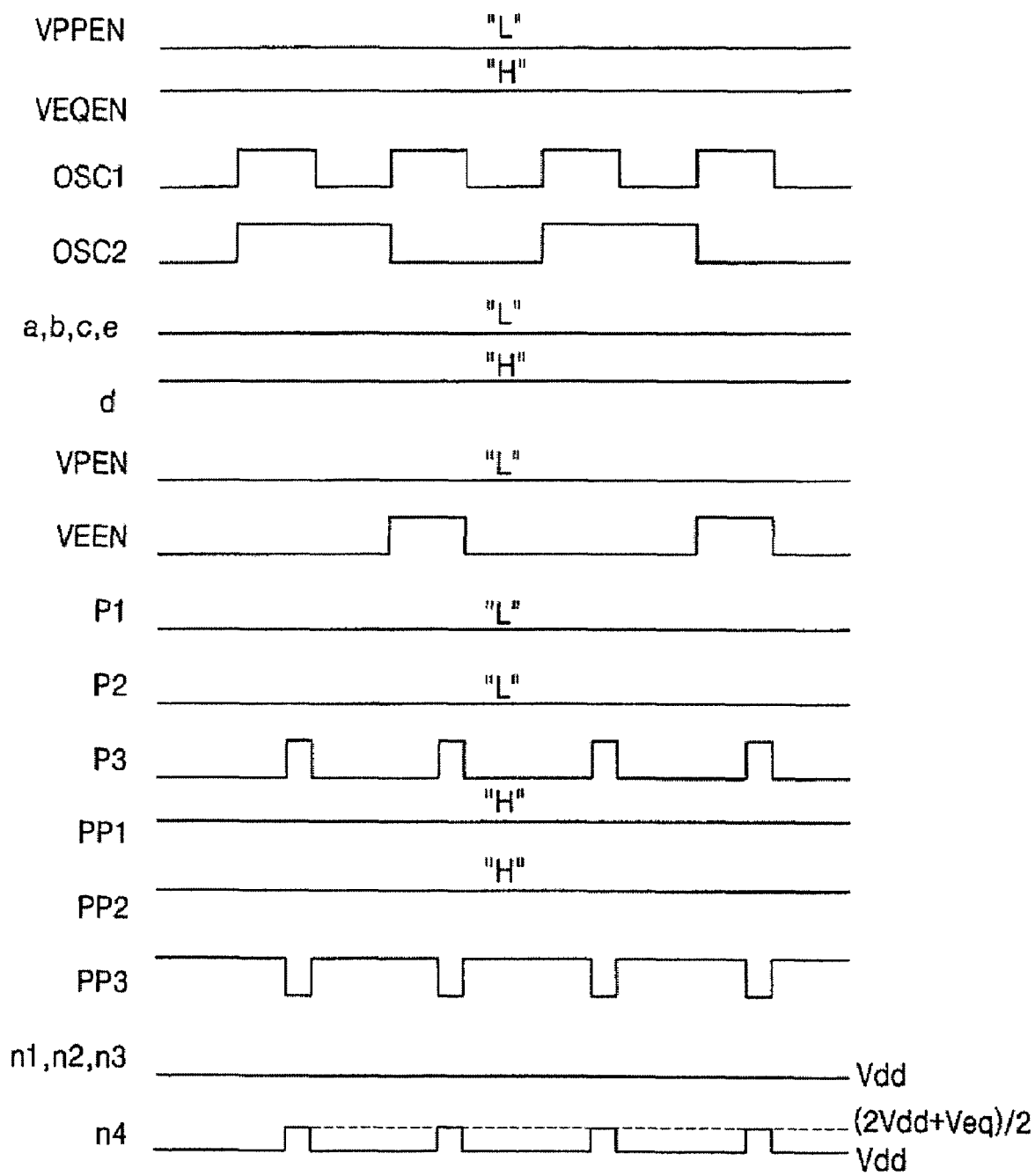

FIGS. 3A through 3C are timing diagrams illustrating operations of the voltage generation circuit and controller shown in FIGS. 1 and 2. Specifically, FIG. 3A illustrates the operation of the voltage generation circuit when both the high voltage level detection signal VPPEN and the precharge voltage level detection signal VEQEN are at high logic levels, FIG. 3B illustrates the operation of the voltage generation circuit when the high voltage level detection signal VPPEN is at a high logic level and the precharge voltage level detection signal VEQEN is at a low logic level, and FIG. 3C illustrates the operation of the voltage generation circuit when the precharge voltage level detection signal VEQEN is at a high logic level and the high voltage level detection signal VPPEN is at a low logic level.

Referring to FIG. 3A, when both the high voltage level detection signal VPPEN and the precharge voltage level detection signal VEQEN are at high logic levels, the sixth signal f of FIG. 2 gets to a high logic level. Thus, the oscillator 26-1 and the divider 26-2 perform their respective operations to generate the first and second oscillation signals OSC1 and OSC2. Also, the first and third detection circuits 20 and 24 generate the first and fourth signals a and d that are at low logic levels, and the second detection circuit 22 generates the second signal b that is at a high logic level. The high voltage pumping control signal generator 28 generates the second oscillation signal OSC2 as the third signal c in response to the second signal b that is at a high logic level and generates the first oscillation signal OSC1 as the high voltage pumping control signal VPEN in response to the third signal c. The precharge voltage pumping control signal generator 30 generates the inverted second oscillation signal OSC2 as the fifth signal e in response to the second signal b that is at a high logic level and generates the first oscillation signal OSC1 as the precharge voltage pumping control signal VEEN in response to the fifth signal e. The control signal generator 32 alternately performs an operation of generating the first, second and third pumping control signals P1, P2, and P3 in sequence in response to the high voltage pumping control signal VPEN and an operation of generating the third pumping control signal P3 in response to the precharge voltage pumping control signal VEEN. Also, the control signal generator 32 generates the first precharge control signal PP1, which is an inverted first pumping control signal P1, generates the second precharge control signal PP2, which is inactive when the first pumping control signal P1 is active and active when the second pumping control signal P2 is inactive, and generates the third precharge control signal PP3, which is inactive when the first pumping control signal P1 is active and active when the third pumping control signal P3 is inactive.

In the high voltage and precharge voltage generator 16, when the first, second and third pumping control signals P1, P2, and P3 are activated in sequence, the first, second, third and sixth switches SW1, SW2, SW3, and SW6 are turned on in response to the first through third precharge control signals PP1-PP3 that are at high logic levels, so that the first, second, third and boost nodes n1, n2, n3 and n4 are precharged to about the level of the power supply voltage Vdd. In this state, once the first, second and third precharge control signals PP1, PP2, and PP3 get to a low logic level and the first pumping control signal P1 gets to a high logic level, the first and second switches SW1 and SW2 are turned off and the first and second capacitors C1 and C2 allow the first and second nodes n1 and n2 to be pumped to about 2Vdd. After that, the fourth and fifth switches SW4 and SW5 are turned on, and the first and boost nodes n1 and n4 share charge and the second and third nodes n2 and n3 also share charge so that the first, second, third and boost nodes n1, n2, n3 and n4 are charged to about 1.5Vdd. Thereafter, once the first precharge control signal PP1 gets to a high logic level and the second pumping control signal P2 gets to a high logic level, the first and second switches SW1 and SW2 are turned on, so that the first and second nodes n1 and n2 are precharged to about Vdd and the third capacitor C3 allows the third node n3 to be pumped to about 2.5Vdd. After that, the seventh switch SW7 is turned on, and thus the third and boost nodes n3 and n4 share charge so that both the third and boost nodes n3 and n4 are charged to about 2Vdd. Thereafter, once the second precharge control signal PP2 gets to a high logic level and the third pumping control signal P3 gets to a high logic level, the third switch SW3 is turned on so that the third node n3 is precharged to about Vdd and the fourth capacitor C4 allows the boost node n4 to be pumped to about 3Vdd. Thereafter, the eighth switch SW8 is turned on, and charge is shared by the boost node n4 and a high voltage generation terminal so that both the boost node n4 and the high voltage generation terminal are charged to about (3Vdd+Vpp)/2. Also, once the third precharge control signal PP3 gets to a high logic level, the sixth switch SW6 is turned on so that the boost node n4 is precharged to about Vdd. In this manner, the high voltage and precharge voltage generator 16 performs a high voltage pumping operation.

In the high voltage and precharge voltage generator 16, when the first pumping control signal P1 is not active and the second and third pumping control signals P2 and P3 are activated in sequence, the first, second, third and sixth switches SW1, SW2, SW3, and SW6 are turned on in response to the first through third precharge control signals PP1-PP3 that are at high logic levels, so that the first, second, third and boost nodes n1, n2, n3 and n4 are precharged to about Vdd. In this state, once the third pumping control signal P3 gets to a high logic level, the fourth capacitor C4 allows the boost node n4 to be pumped to about 2Vdd. After that, the ninth switch SW9 is turned on, and charge is shared by the boost node n4 and a precharge voltage generation terminal so that both the boost node n4 and the precharge voltage generation terminal are charged to about (2Vdd+Veq)/2. Thereafter, once the third precharge control signal PP3 gets to a high logic level, the boost node n4 is precharged to about Vdd. In this manner, the high voltage and precharge voltage generator 16 performs a precharge voltage pumping operation.

Referring to FIG. 3B, when the high voltage level detection signal VPPEN is active at a high logic level and the precharge voltage level detection signal VEQEN is inactive at a low logic level, only the high voltage pumping control signal VPEN is active continuously, so that the first, second and third pumping control signals P1, P2, and P3 are activated in sequence. Accordingly, the high voltage and precharge voltage generator 16 keeps performing the same high voltage pumping operation as described with reference to FIG. 3A.

Referring to FIG. 3C, when the high voltage level detection signal VPPEN is inactive at a low logic level and the precharge voltage level detection signal VEQEN is active at a high logic level, only the precharge voltage pumping control signal VEEN is active continuously, so that only the third pumping control signal P3 is activated. Accordingly, the high voltage and precharge voltage generator 16 keeps performing the same precharge voltage pumping operation as described with reference to FIG. 3A.

In the present embodiment the voltage generation circuit generates the precharge voltage Veq by performing a pumping operation using only the third pumping control signal P3. However, when it is necessary to boost the precharge voltage Veq to a higher level, the voltage generation circuit may generate the precharge voltage Veq by performing a pumping operation using the second and third pumping control signals P2 and P3. In this case, the control signal generator 32 may be adjusted to generate the second and third pumping control signals P2 and P3 that are activated in sequence in response to the precharge voltage pumping control signal VEEN.

Figure 4:
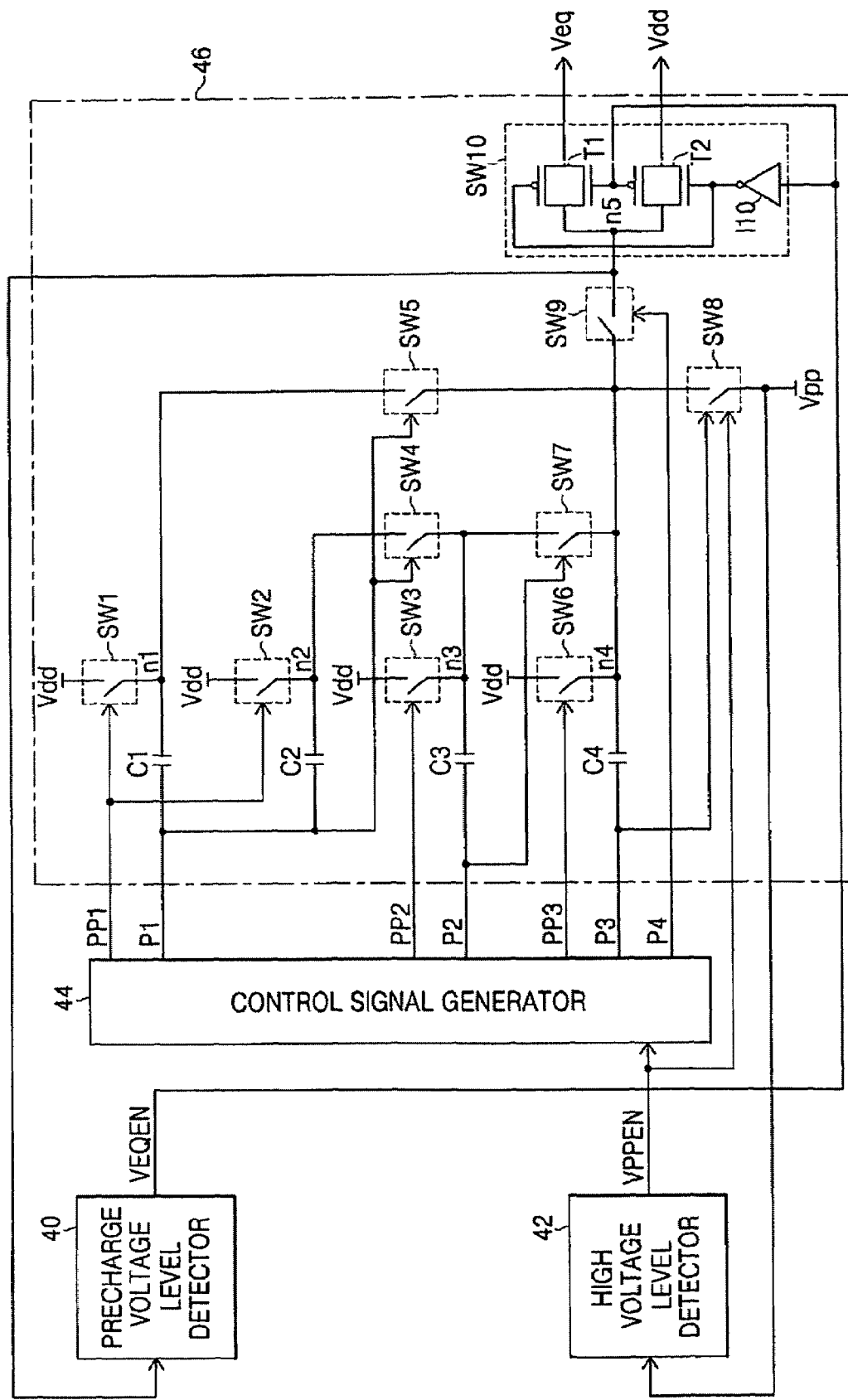
FIG. 4 is a block diagram of a voltage generation circuit according to another exemplary embodiment of the present invention.

FIG. 4 is a block diagram of a voltage generation circuit according to another exemplary embodiment of the present invention. In the present embodiment, the voltage generation circuit includes a precharge voltage level detector 40, a high voltage level detector 42, a control signal generator 44, and a high voltage and precharge voltage generator 46. The high voltage and precharge voltage generator 46 includes capacitors C1-C4 and switches SW1-SW10, and the switch SW10 includes CMOS transmission gates T1 and T2 and an inverter I10.

The functions of the precharge voltage level detector 40 and the high voltage level detector 42 are the same as those of the precharge voltage level detector 10 and the high voltage level detector 12 shown in FIG. 1. The control signal generator 44 generates first, second and third pumping control signals P1, P2, and P3 in sequence when a high voltage level detection signal VPPEN is active and generates a fourth pumping control signal P4 when the high voltage level detection signal VPPEN is inactive. That is, the control signal generator 44 generates the first through fourth pumping control signals P1-P4 in response to the high voltage level detection signal VPPEN irrespective of whether a precharge voltage level detection signal VEQEN is active or not. The functions of the capacitors C1-C4 and the switches SW1-SW8 are the same as those of the capacitors C1-C4 and the switches SW1-SW8 shown in FIG. 1. The switch SW9 is turned on in response to the fourth pumping control signal P4. The switch SW10 transmits charge to a power supply voltage generation terminal in response to the precharge voltage level detection signal VEQEN that is at a low logic level and transmits charge to a precharge voltage generation terminal in response to the precharge voltage level detection signal VEQEN that is at a high logic level. The CMOS transmission gate T1 is turned on in response to the precharge voltage level detection signal VEQEN that is at a high logic level, thus elevating the voltage level of the precharge voltage Veq. Also, the CMOS transmission gate T1 is turned on in response to the precharge voltage level detection signal VEQEN that is at a low logic level, thus elevating the voltage level of the power supply voltage Vdd.

In other words, the voltage generation circuit shown in FIG. 4 does not directly precharge a voltage of a boost node n4, which is pumped by the high voltage and precharge voltage generator 46, but makes use of the voltage of the boost node n4 to elevate the voltage level of the precharge voltage Veq.

Accordingly, since the voltage generation circuit shown in FIG. 4 requires no additional capacitor for pumping operations to generate the precharge voltage, it can be integrated with a small layout area.

Figure 5:
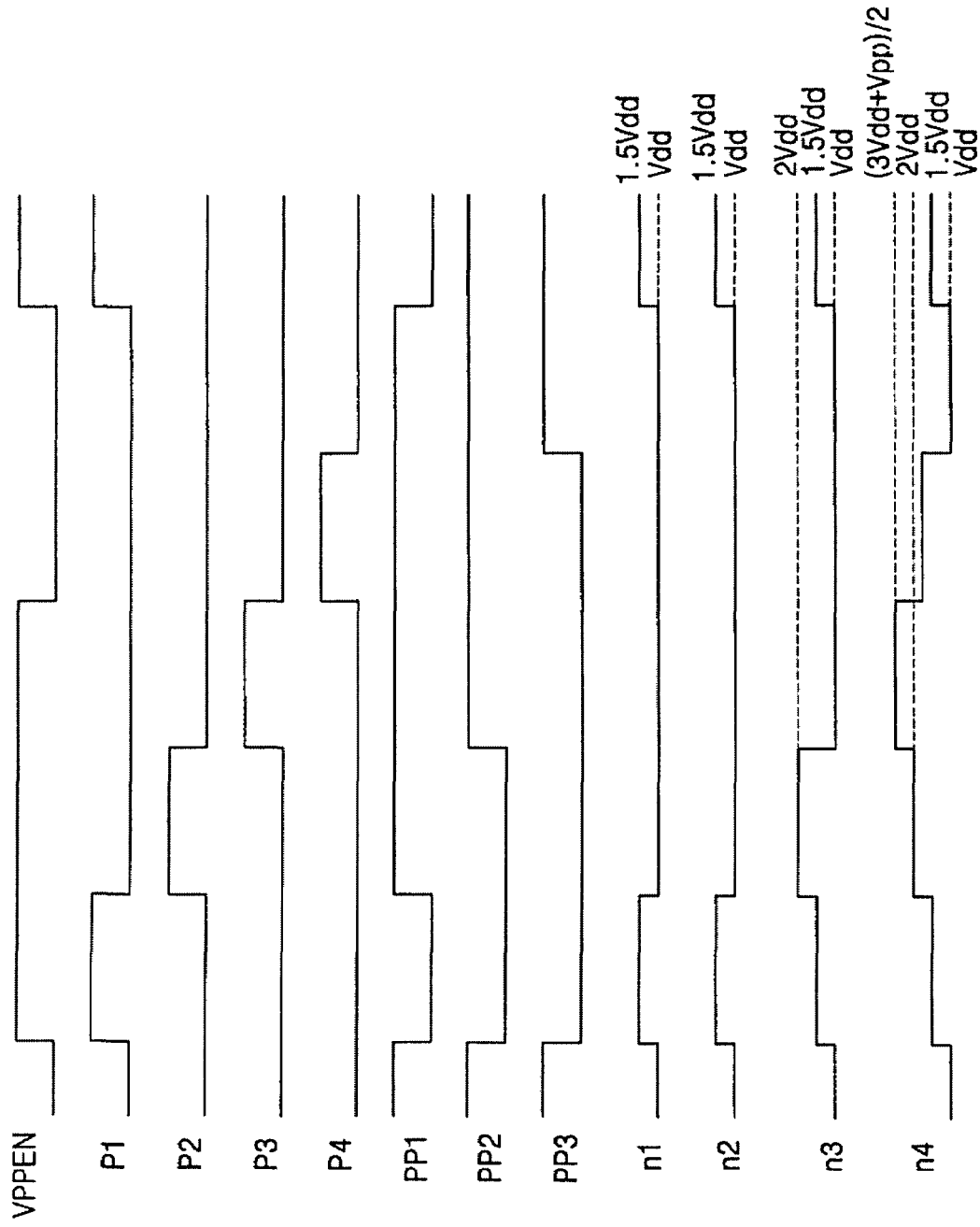
FIG. 5 is a timing diagram illustrating operations of the voltage generation circuit shown in FIG. 4.

FIG. 5 is a timing diagram illustrating operations of the voltage generation circuit shown in FIG. 4. The operations of the voltage generation circuit shown in FIG. 4 will be described below with reference to FIG. 5.

When the high voltage level detection signal VPPEN is at a high logic level, the first, second and third pumping control signals P1, P2, and P3 are activated in sequence. Since an operation of generating the high voltage Vpp by elevating the voltage levels of the first, second, third and boost nodes n1, n2, n3 and n4 in response to the first, second and third pumping control signals P1, P2, and P3 is the same as described with reference to FIG. 3A, a description thereof will be omitted here.

After the high voltage Vpp is generated, the boost node n4 is charged to about (3Vdd+Vpp)/2. Then, when the high voltage level detection signal VPPEN is inactive at a low logic level, the control signal P4 is activated. Once the control signal P4 is active, the switch SW9 is turned on so that charge is transmitted from the boost node n4 to a fifth node n5. In this case, if the precharge voltage level detection signal VEQEN is at a high logic level, the CMOS transmission gate T1 is turned on, and thus the charge transmitted to the fifth node n5 is transmitted to the precharge voltage generation terminal to elevate the precharge voltage Veq. If the precharge voltage level detection signal VEQEN is at a low logic level, the CMOS transmission gate T2 is turned on, and the charge transmitted to the fifth node n5 is transmitted to the power supply voltage generation terminal to elevate the power supply voltage Vdd. Thereafter, once the third precharge control signal PP3 is active, the switch SW6 is turned on so that the boost node n4 is precharged to about Vdd.

When the high voltage level detection signal VPPEN is active, the voltage generation circuit shown in FIG. 4 generates the high voltage Vpp. When the high voltage level detection signal VPPEN is inactive and the precharge voltage level detection signal VEQEN is active, the voltage generation circuit shown in FIG. 4 transmits charge from the boost node n4, which is produced during the generation of the high voltage Vpp, to the precharge voltage generation terminal and then precharges the charge of the boost node n4. In other words, the voltage generation circuit shown in FIG. 4 reuses the charge from the boost node n4, which is produced during the generation of the high voltage Vpp, to elevate the level of the precharge voltage Veq.

Figure 6:
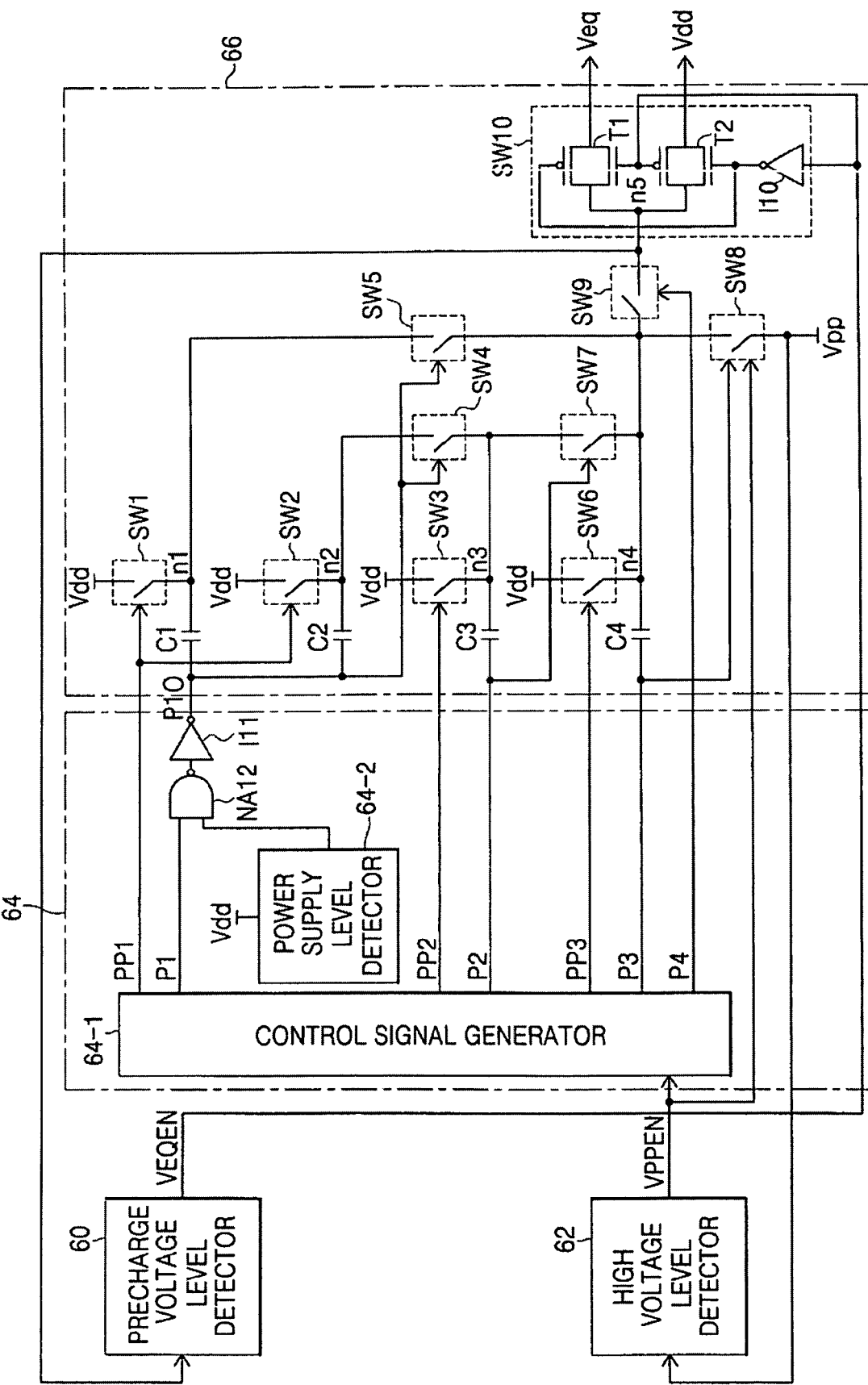
FIG. 6 is a block diagram of a voltage generation circuit according to yet another exemplary embodiment of the present invention.

FIG. 6 is a block diagram of a voltage generation circuit according to yet another exemplary embodiment of the present invention. In the present embodiment, the voltage generation circuit includes a precharge voltage level detector 60, a high voltage level detector 62, a controller 64, and a high voltage and precharge voltage generator 66. Also, the controller 64 includes a control signal generator 64-1, a power supply voltage level detector 64-2, a NAND gate NA12, and an inverter I11. The high voltage and precharge voltage generator 66 is structurally the same as the high voltage and precharge voltage generator 46 shown in FIG. 4.

Since the operations of the precharge voltage level detector 60 and the high voltage level detector 62 are the same as those of the precharge voltage level detector 10 and the high voltage level detector 12 shown in FIG. 1, a description thereof will be omitted here. Also, since the operations of the high voltage and precharge voltage generator 66 and the control signal generator 64-1 are the same as those of the high voltage and precharge voltage generator 46 and the control signal generator 44 shown in FIG. 4, a description thereof will be omitted. Accordingly, only the functions of additional blocks will be described here.

The power supply voltage level detector 64-2 detects whether a power supply voltage Vdd is at a high level or low level and generates a power supply voltage level detection signal DET. For example, when the power supply voltage Vdd is lower than half of the high voltage (Vpp/2), it is at a low logic level, and when the power supply voltage Vdd is equal to or higher than the half of the high voltage (Vpp/2), it is at a high logic level. When the power supply voltage level detector 64-2 detects a low power supply voltage, it generates a power supply voltage level detection signal DET that is at a low logic level. Also, when the power supply voltage level detector 64-2 detects a high power supply voltage, it generates a power supply voltage level detection signal DET that is at a high logic level. The NAND gate NA12 and the inverter I11 generate a control signal P1O that is at a high logic level when both the first pumping control signal P1 and the power supply voltage level detection signal DET are at high logic levels. However, when the first pumping control signal P1 is at a high logic level and the power supply voltage level detection signal DET is at a low logic level, the NAND gate NA12 and the inverter I11 generate the control signal P1O that is at a low logic level. That is, the NAND gate NA12 and the inverter I11 activate the control signal P1O during the active period of the first pumping control signal P1 when the power supply voltage Vdd is at a high level and deactivate the control signal P1O even during the active period of the first pumping control signal P1 when the power supply voltage Vdd is at a low level.

When the control signal P1O is activated, the high voltage and precharge voltage generator 66 performs the same operation as the high voltage and precharge voltage generator 46 shown in FIG. 4. When the control signal P1O is deactivated, capacitors C1 and C2 do not perform a pumping operation but only capacitors C3 and C4 perform a pumping operation.

The voltage generation circuit shown in FIG. 6 may generate high voltages Vdd different from each other according to the level of the power supply voltage Vdd and also, generate a precharge voltage Veq without any additional capacitor for generating the precharge voltage Veq. Accordingly, the voltage generation circuit shown in FIG. 6 can be integrated with a small layout area.

Figure 7B:
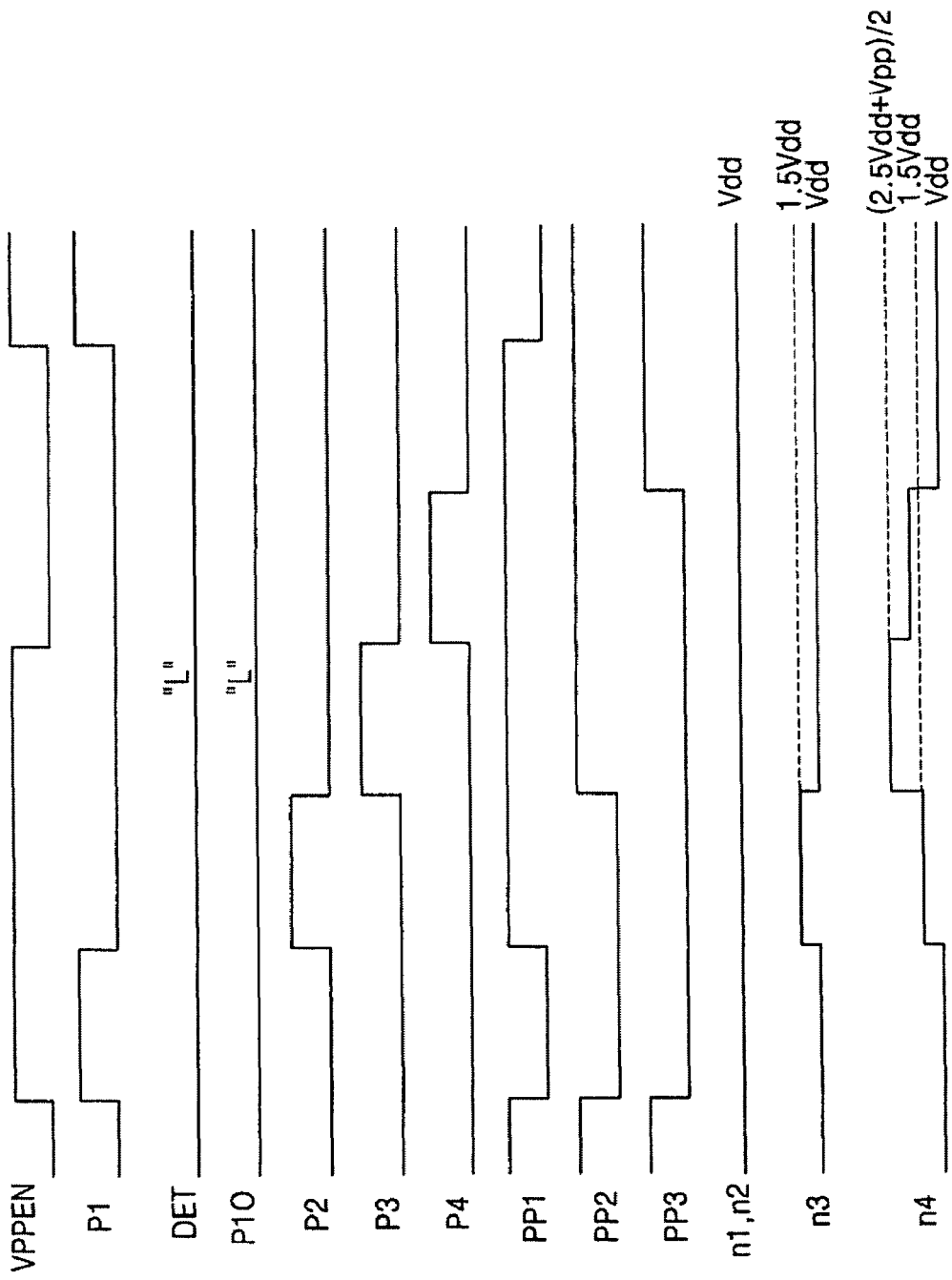

FIGS. 7A and 7B are timing diagrams illustrating operations of the voltage generation circuit shown in FIG. 6. Specifically, FIG. 7A illustrates the operation of the voltage generation circuit when the power supply voltage Vdd is at a high level, and FIG. 7B illustrates the operation of the voltage generation circuit when the power supply voltage Vdd is at a low level.

Referring to FIG. 7A, when a high voltage level detection signal VPPEN is activated, the control signal generator 64-1 generates the first, second and third pumping control signals P1, P2, and P3 in sequence. When the power supply voltage level detection signal DET is at a high logic level, the first, second and third pumping control signals P1, P2, and P3 are activated in sequence. Then, the high voltage and precharge voltage generator 66 performs the same operation as described with reference to FIG. 5 to generate the high voltage Vpp.

When the high voltage level detection signal VPPEN is inactive, the control signal generator 64-1 generates a control signal P4. Then, the high voltage and precharge voltage generator 66 performs the same operation as described with reference to FIG. 5.

Referring to FIG. 7B, when the high voltage level detection signal VPPEN is activated, the control signal generator 64-1 generates the first, second and third pumping control signals P1, P2, and P3 in sequence, When the power supply voltage level detection signal DET is at a low logic level, the first pumping control signal P1 is deactivated and the second and third pumping control signals P2 and P3 are activated in sequence. Then, the high voltage and precharge voltage generator 66 performs a pumping operation in response to the second and third pumping control signals P2 and P3 to generate the high voltage Vpp. In other words, when the second pumping control signal P2 is activated, the capacitor C3 allows a node n3 to be pumped to about 2Vdd. Thereafter, a switch SW7 is turned on, and charge is shared by the node n3 and a boost node n4 so that the third and boost nodes n3 and n4 are charged to about 1.5Vdd. When the third pumping control signal P3 is active, the capacitor C4 allows the boost node n4 to be pumped to about 2.5Vdd. Thereafter, a switch SW8 is turned on, and charge is shared by the boost node n4 and the high voltage generation terminal so that the boost node n4 and the high voltage generation terminal are charged to about ((2.5Vdd+Vpp)/2. As a result, the capacitors C3 and C4 perform a pumping operation twice to generate the high voltage Vpp. Accordingly, when the power supply voltage level detection signal DET is at a low logic level, the high voltage and precharge voltage generator 66 generates the high voltage Vpp that is at a lower level than the high voltage Vpp generated when the power supply voltage level detection signal DET is at a high logic level.

Also, when the high voltage level detection signal VPPEN is inactive, the control signal generator 64-1 generates the control signal P4. Then, a switch SW9 is turned on so that charge is transmitted from the boost node n4 to a fifth node n5. Also, when a precharge voltage level detection signal VEQEN is at a high logic level, a CMOS transmission gate T1 is turned on to elevate the precharge voltage Veq. When the precharge voltage level detection signal VEQEN is at a low logic level, a CMOS transmission gate T2 is turned on to elevate the power supply voltage Vdd. Thereafter, when the third precharge control signal PP3 is activated, a switch SW6 is turned on so that the boost node n4 is precharged to about Vdd.

In conclusion, the voltage generation circuit shown in FIG. 6 can sense the level of the power supply voltage Vdd to generate two different high voltages and can generate the precharge voltage Veq without any additional capacitor for generating the precharge voltage Veq.

In the above-described embodiments, switches may be comprised of MOS transistors. In this case, control signals are transmitted to gates of the MOS transistors.

The voltage generation circuit according to the present invention can generate at least two voltages, such as a high voltage and a precharge voltage, which are different from each other and higher than a power supply voltage. This circuit can generate the precharge voltage without using additional capacitors and without increasing its layout area from a single high voltage generator circuit. Accordingly, the high voltage generation circuit can be integrated into semiconductor memory devices using a small layout area. Other embodiments can generate different voltages by performing multiple pumping operations.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A voltage generation circuit comprising:
   a voltage level detector, which detects a level of a first high voltage to generate a first high voltage level detection signal and detects a level of a second high voltage to generate a second high voltage level detection signal;
   a control signal generator, which generates at least three pumping control signals activated in sequence in response to the first high voltage level detection signal and activates at least one pumping control signal among the at least three pumping control signals in response to the second high voltage detection signal; and
   a voltage generator, which pumps a boost node in response to the at least three pumping control signals to generate the first high voltage and pumps the boost node in response to the at least one pumping control signal to generate the second high voltage.

2. The voltage generation circuit according to claim 1, wherein when the first and second high voltage level detection signals are active at about the same time, the control signal generator alternately performs an operation of generating a first one, a second one, and a third one of the at least three pumping control signals in sequence and an operation of activating the at least one of the at least three pumping control signals.

3. The voltage generation circuit according to claim 2, wherein the control signal generator comprises:
   a detection signal generator, which generates a first detection signal when the first high voltage level detection signal is active, generates a second detection signal when the second high voltage level detection signal is active, and generates a third detection signal when the first and second high voltage level detection signals are active at about the same time;
   an oscillation signal generator, which generates a first oscillation signal in response to the first high voltage level detection signal or the second high voltage level detection signal and generates a second oscillation signal by dividing the first oscillation signal;
   a first high voltage pumping control signal generator, which generates a first signal from the second oscillation signal when the third detection signal is generated and generates a first high voltage pumping control signal from the first oscillation signal in response to the first high voltage level detection signal or the first signal; and
   a second high voltage pumping control signal generator, which generates a second signal from an inverted second oscillation signal when the third detection signal is generated and generates a second high voltage pumping control signal from the first oscillation signal in response to the second high voltage level detection signal or the second signal,
   wherein the control signal generator generates the at least three pumping control signals in response to the first high voltage pumping control signal and generates the at least one of the at least three pumping control signals in response to the second high voltage pumping control signal.

4. The voltage generation circuit according to claim 3, wherein the control signal generator generates a first precharge control signal in response to the first one of the at least three pumping control signals, generates a second precharge control signal in response to the first one and the second one of the at least three pumping control signals, and generates a third precharge control signal in response to the first one, the second one, and the third one of the at least three pumping control signals.

5. The voltage generation circuit according to claim 4, wherein the voltage generator comprises:
a first and second pumping and precharge unit, which pumps a first node and a second node in response to the first one of the at least three pumping control signals and performs charge sharing operations between the first node and the boost node and between the second node and a third node during the generation of the first high voltage, and precharges the first and second nodes in response to the first precharge control signal;
a third pumping and precharge unit, which pumps the third node in response to the second one of the at least three pumping control signals and performs a charge sharing operation between the third node and the boost node during the generation of the first high voltage, and precharges the third node in response to the second precharge control signal; and
a fourth pumping and precharge unit, which pumps the boost node in response to the third one of the at least three pumping control signals and performs a charge sharing operation between the boost node and a first high voltage generation terminal during the generation of the first high voltage, pumps the boost node in response to the third one of the at least three pumping control signals and performs a charge sharing operation between the boost node and a second high voltage generation terminal during the generation of the second high voltage, and precharges the boost node in response to the third precharge control signal.

6. The voltage generation circuit according to claim 5, wherein the first and second pumping and precharge unit comprises:
a first switch, which is connected between a power supply voltage and the first node and precharges the first node in response to the first precharge control signal;
a first capacitor, which pumps the first node in response to the first one of the at least three pumping control signals;
a second switch, which is connected between the power supply voltage and the second node and precharges the second node in response to the first precharge control signal;
a second capacitor, which pumps the second node in response to the first one of the at least three pumping control signals;
a third switch, which is turned on in response to the first one of the at least three pumping control signals and allows charge to be shared by the first node and the boost node; and
a fourth switch, which is turned on in response to the first one of the at least three pumping control signals and allows charge to be shared by the second node and the third node.

7. The voltage generation circuit according to claim 6, wherein the third pumping and precharge unit comprises:
a fifth switch, which is connected between the power supply voltage and the third node and is turned on in response to the second precharge control signal to precharge the third node;
a third capacitor, which pumps the third node in response to the second one of the at least three pumping control signals; and
a sixth switch, which is turned on in response to the second one of the at least three pumping control signals and allows charge to be shared by the third node and the boost node.

8. The voltage generation circuit according to claim 7, wherein the fourth pumping and precharge unit comprises:
a seventh switch, which is connected between the power supply voltage and the boost node and precharges the boost node in response to the third precharge control signal;
a fourth capacitor, which pumps the boost node in response to the third one of the at least three pumping control signals;
an eighth switch, which allows charge to be shared by the boost node and the first high voltage generation terminal in response to the third one of the at least three pumping control signals during the generation of the first high voltage; and
a ninth switch, which allows charge to be shared by the boost node and the second high voltage generation terminal in response to the third one of the at least three pumping control signals during the generation of the second high voltage.

9. The voltage generation circuit according to claim 4, wherein the voltage generator comprises:
a first and second pumping and precharge unit, which pumps a first node and a second node in response to the first one of the at least three pumping control signals and performs charge sharing operations between the first node and the boost node and between the second node and a third node during the generation of the first high voltage, and precharges the first and second nodes;
a third pumping and precharge unit, which pumps the third node in response to the second one of the at least three pumping control signals and performs a charge sharing operation between the third node and the boost node during the generation of the first and second high voltages, and precharges the third node; and
a fourth pumping and precharge unit, which pumps the boost node in response to the third one of the at least three pumping control signals and performs a charge sharing operation between the boost node and a first high voltage generation terminal during the generation of the first high voltage, pumps the boost node in response to the third one of the at least three pumping control signals and performs a charge sharing operation between the boost node and a second high voltage generation terminal during the generation of the second high voltage, and precharges the boost node.

10. A semiconductor memory device including a voltage generation circuit comprising:
a voltage level detector, which detects a level of a high voltage to generate a high voltage level detection signal and detects a level of a precharge voltage to generate a precharge voltage level detection signal;
a control signal generator, which generates at least three pumping control signals activated in sequence in response to the high voltage level detection signal and activates at least one pumping control signal among the at least three pumping control signals in response to the precharge voltage level detection signal; and
a voltage generator, which pumps a boost node in response to the at least three pumping control signals to generate the high voltage and transmits a boost node to a precharge voltage generation terminal in response to the at least one pumping control signal to generate the precharge voltage.

11. The device according to claim 10, wherein when the high voltage level detection signal and the precharge voltage level detection signal are active at about the same time, the control signal generator alternately performs an operation of generating a first one, a second one, and a third one of the at least three pumping control signals in sequence and an operation of activating the at least one of the at least three pumping control signals.

12. The device according to claim 11, wherein the control signal generator comprises:
- a detection signal generator, which generates a first detection signal when the high voltage level detection signal is active, generates a second detection signal when the precharge voltage level detection signal is active, and generates a third detection signal when the high voltage level detection signal and the precharge voltage level detection signal are active at about the same time;
- an oscillation signal generator, which generates a first oscillation signal in response to the high voltage level detection signal or the precharge voltage level detection signal and generates a second oscillation signal by dividing the first oscillation signal;
- a first high voltage pumping control signal generator, which generates a first signal from the second oscillation signal when the third detection signal is generated and generates a first high voltage pumping control signal from the first oscillation signal in response to the high voltage level detection signal or the first signal; and
- a second high voltage pumping control signal generator, which generates a second signal from an inverted second oscillation signal when the third detection signal is generated and generates a second high voltage pumping control signal from the first oscillation signal in response to the precharge voltage level detection signal or the second signal,
- wherein the control signal generator generates the at least three pumping control signals in response to the high voltage pumping control signal and generates the at least one of the at least three pumping control signals in response to the precharge voltage pumping control signal.

13. The device according to claim 12, wherein the control signal generator generates a first precharge control signal in response to the first one of the at least three pumping control signals, generates a second precharge control signal in response to the first one and the second one of the at least three pumping control signals, and generates a third precharge control signal in response to the first one, the second one, and the third one of the at least three pumping control signals.

14. The device according to claim 13, wherein the voltage generator comprises:
- a first and second pumping and precharge unit, which pumps a first node and a second node in response to the first one of the at least three pumping control signals and performs charge sharing operations between the first node and the boost node and between the second node and a third node during the generation of the first high voltage, and precharges the first and second nodes in response to the first precharge control signal;
- a third pumping and precharge unit, which pumps the third node in response to the second one of the at least three pumping control signals and performs a charge sharing operation between the third node and the boost node during the generation of the first high voltage, and precharges the third node in response to the second precharge control signal; and
- a fourth pumping and precharge unit, which pumps the boost node in response to the third one of the at least three pumping control signals and performs a charge sharing operation between the boost node and a first high voltage generation terminal during the generation of the first high voltage, pumps the boost node in response to the third one of the at least three pumping control signals and performs a charge sharing operation between the boost node and a second high voltage generation terminal during the generation of the second high voltage, and precharges the boost node in response to the third precharge control signal.

15. The device according to claim 14, wherein the first and second pumping and precharge unit comprises:
- a first switch, which is connected between a power supply voltage and the first node and precharges the first node in response to the first precharge control signal;
- a first capacitor, which pumps the first node in response to the first one of the at least three pumping control signals;
- a second switch, which is connected between the power supply voltage and the second node and precharges the second node in response to the first precharge control signal;
- a second capacitor, which pumps the second node in response to the first one of the at least three pumping control signals;
- a third switch, which is turned on in response to the first one of the at least three pumping control signals and allows charge to be shared by the first node and the boost node; and
- a fourth switch, which is turned on in response to the first one of the at least three pumping control signals and allows charge to be shared by the second node and the third node.

16. The device according to claim 15, wherein the third pumping and precharge unit comprises:
- a fifth switch, which is connected between the power supply voltage and the third node and is turned on in response to the second precharge control signal to precharge the third node;
- a third capacitor, which pumps the third node in response to the second one of the at least three pumping control signals; and
- a sixth switch, which is turned on in response to the second one of the at least three pumping control signals and allows charge to be shared by the third node and the boost node.

17. The device according to claim 16, wherein the fourth pumping and precharge unit comprises:
- a seventh switch, which is connected between the power supply voltage and the boost node and precharges the boost node in response to the third precharge control signal;
- a fourth capacitor, which pumps the boost node in response to the third one of the at least three pumping control signals;
- an eighth switch, which allows charge to be shared by the boost node and the first high voltage generation terminal in response to the third one of the at least three pumping control signals during the generation of the first high voltage; and
- a ninth switch, which allows charge to be shared by the boost node and the second high voltage generation terminal in response to the third one of the at least three pumping control signals during the generation of the second high voltage.

18. The device according to claim 13, wherein the voltage generator comprises:

a first and second pumping and precharge unit, which pumps a first node and a second node in response to the first one of the at least three pumping control signals and performs charge sharing operations between the first node and the boost node and between the second node and a third node during the generation of the high voltage, and precharges the first and second nodes;

a third pumping and precharge unit, which pumps the third node in response to the second one of the at least three pumping control signals and performs a charge sharing operation between the third node and the boost node during the generation of the high voltage and the precharge voltage, and precharges the third node; and a fourth pumping and precharge unit, which pumps the boost node in response to the third one of the at least three pumping control signals and performs a charge sharing operation between the boost node and a high voltage generation terminal during the generation of the first high voltage, pumps the boost node in response to the third one of the at least three pumping control signals and performs a charge sharing operation between the boost node and the precharge voltage generation terminal during the generation of the precharge voltage, and precharges the boost node.

* * * * *